United States Patent [19]

Inoue et al.

[11] Patent Number: 4,583,223

[45] Date of Patent: Apr. 15, 1986

[54] TESTING SYSTEM

[75] Inventors: Fumihito Inoue, Higashiyamato; Yuichi Ohyama, Isesaki; Kinichi Nakahara, Takasaki; Kazuhiko Kimura, Kodaira, all of Japan

[73] Assignee: Hitachi, Ltd., Tokyo, Japan

[21] Appl. No.: 475,158

[22] Filed: Mar. 14, 1983

[30] Foreign Application Priority Data

Mar. 17, 1982 [JP] Japan .................................. 57-40792

[51] Int. Cl.⁴ ............................................ G01R 31/28
[52] U.S. Cl. .................... 371/20; 324/73 R; 371/25
[58] Field of Search .................. 364/579, 580; 371/16, 371/20, 25; 324/73 R, 73 AT

[56] References Cited

U.S. PATENT DOCUMENTS

| 3,492,572 | 1/1970 | Jones et al. ........................... 371/28 |
| 4,055,801 | 10/1977 | Pike et al. .......................... 324/73 R |
| 4,102,491 | 7/1978 | DeVito et al. ........................ 371/20 |
| 4,168,527 | 9/1979 | Winkler .............................. 364/580 |
| 4,236,246 | 11/1980 | Skilling .............................. 371/25 X |
| 4,270,178 | 5/1981 | Lillig ................................. 364/579 |

FOREIGN PATENT DOCUMENTS

| 1376442 | 1/1972 | United Kingdom . |
| 1278694 | 6/1972 | United Kingdom . |
| 1278632 | 6/1972 | United Kingdom . |
| 2019011 | 10/1979 | United Kingdom . |
| 2100448 | 12/1982 | United Kingdom . |

OTHER PUBLICATIONS

Barnard et al, Integrated Circuit Test System, IBM Technical Disclosure Bulletin, vol. 14, No. 4, p. 1067, 9/71.
Chrisfield et al., OV/UV Detection Circuitry, IBM Technical Disclosure Bulletin, vol. 20, No. 9, p. 3589, 2/78.
GenRad's 2270: Your Total In-Circuit Solution, Technical Bulletin.

Primary Examiner—Charles E. Atkinson
Attorney, Agent, or Firm—Antonelli, Terry & Wands

[57] ABSTRACT

A first signal generator and a second signal generator for setting measuring conditions of a connection pin of a device under test are disposed in each of a number of signal transmission circuits. Each of the signal generators stores therein information for setting a measuring condition in the form of a digital data, which is D-A converted, and this D-A converted output determines the measuring condition. Analog switches are disposed for selecting as a measuring condition of the connection pin either the D-A converted output of the first signal generator or that of the second signal generator. A first discriminator and a second discriminator for discriminating the quality of measured results of the connection pin of the device under test are disposed in each of the signal transmission circuits. In each of the discriminators, reference value information for discriminating the quality is stored in the form of digital data, which is D-A converted, and this D-A converted output and a measured result of the connection pin are compared with each other. A controller controls the operation of each of the signal transmission circuits.

15 Claims, 3 Drawing Figures

TESTING SYSTEM

BACKGROUND OF THE INVENTION

The present invention relates to a testing system usable for testing the quality and for measuring various characteristics of a variety of semiconductor devices, such as monolithic and hybrid semiconductor integrated circuits or module circuits.

Recent technical trends related to the design of semiconductor integrated circuits involve an increase in the number of functions performed by an integrated circuit. For example, there is a semiconductor integrated circuit (referred to as simply "IC" hereinafter) that is arranged so as to be usable as a radio receiver, a television receiver and a recording-playback system. On the other hand, with respect to digital functions, there are ICs having various "microcomputer functions". Moreover, there is also an IC that comprises both circuits having an analog function and circuits having a digital function. In such ICs having multiple functions or composite functions, there is inevitably an increase in the number of measuring items (testing items) requiring the measurement of A.C. parameters and D.C. parameters.

Measuring systems for measuring parameters as mentioned above generally have a D.C. parameter measuring portion as a basic component part. FIG. 1 is a block diagram of a testing system considered by us prior to the present invention.

A matrix circuit 1 has its Y axes lines connected to respective external connecting terminals (connection pins) P of an IC 2. Although, if the IC 2 has 28 connection pins, the 28 connection pins P normally are all connected to circuit elements of the IC; however, for convenience of description, only a few circuit elements of the IC are shown. Moreover, the matrix circuit 1 has its X axes lines connected to the measuring sources $e_1$ to $e_6$ for measuring various parameters of the IC 2. The measuring sources $e_1$ to $e_6$ should be different from each other in voltage level, current level and the like. In addition, the output ends of the Y axes lines are connected to an A/D converter 3 and a measuring discriminator 4. Further, the Y axes lines and the X axes lines can be selectively connected together at their respective cross points by means of reed relays (not shown). Therefore, if the $Y_1$ and $X_1$ lines, for example are connected together at their cross point through the corresponding reed relay, a signal $e_1$ is supplied to the IC 2. Then, the output signals of amplifiers 2a, 2b are supplied to the measuring discriminator 4 via the cross point between lines $Y_2$ and $X_7$ and the cross point between lines $Y_3$ and $X_7$ through the A/D converter 3. As a result, the qualities of the amplifiers 2a, 2b are tested by the measuring discriminator 4.

The testing mentioned above is a test of the amplifiers 2a, 2b with respect to only the signal source $e_1$. In practice, it is necessary to carry out a similar testing with respect to the other signal sources $e_2$ to $e_6$ according to need. As a consequence, there is a need for a large number of signal sources for testing in the case of inspecting an IC having both analog functions and digital functions. Accordingly, it is also necessary to provide a large number of reed relays corresponding to the matrix cross points associated with the signal sources.

The D.C. parameter measurement is substantially the same as the semiconductor element test and requires only a short measuring time. The A.C. parameter measurement, however, is substantially the same as the mounted circuit test and generally takes a much longer time than the D.C. parameter measurement, since there are included in the test intrinsic time-constants determined by external inductance L, capacitance C, resistance R and the like. Therefore, the A.C. parameter measurement is replaced by the D.C. parameter measurement, and the number of D.C. parameter measuring items increases with any increase in the degree of integration. Accordingly, the essential subject of the testing system is the increase in the measuring speed rather than economy.

Therefore, we have examined technical trends of ICs and testing systems. As a result, it has been made clear that conventional testing systems have the following defects.

(1) Measuring time per connection pin is long: it takes 2 to 3 msecs.

(2) It is necessary to increase the number of reed relays in a matrix circuit in correspondence with the increase in the number of connection pins, resulting in a more complicated circuit configuration.

(3) The reed relay has a low reliability and is also expensive, causing the system to be higher in cost as a whole.

(4) It takes much time to measure all of the test data, since measured results are serially supplied to the measuring discriminator through the A/D converter.

SUMMARY OF THE INVENTION

It is, therefore, an object of the present invention to provide a testing system for testing a device under test, such as a semiconductor device, that can accurately as well as more speedily carry out various kinds of measurement of the device under test, as well as quality discrimination or testing based on the measured results, and can be manufactured at lower costs.

DESCRIPTION OF THE PREFERRED EMBODIMENTS

Figure 2:
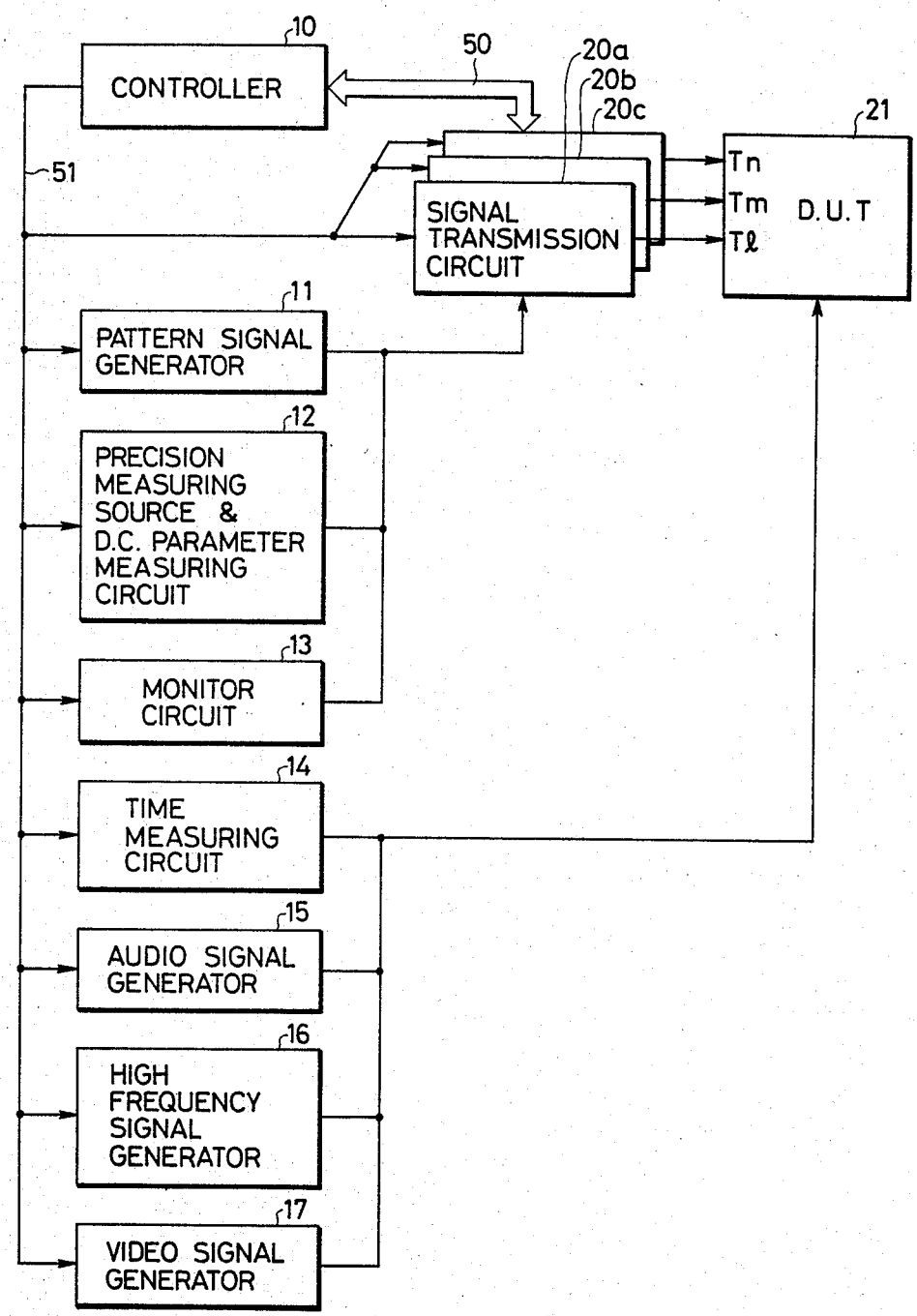
FIG. 2 is a block diagram showing the circuit configuration of a semiconductor device testing system to which the present invention is applied.
Figure 3:
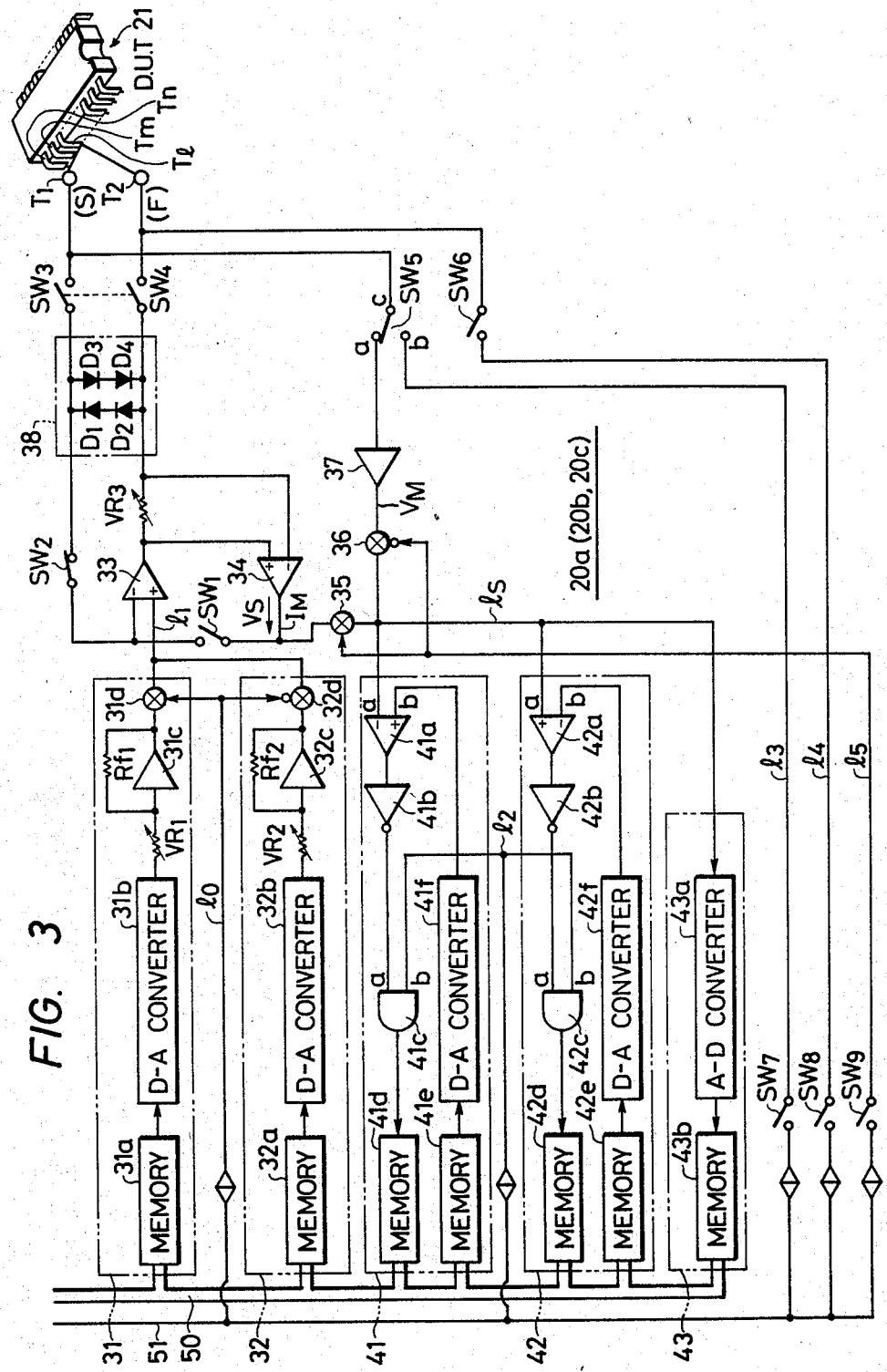
FIG. 3 is a circuit diagram of a signal transmission circuit, for illustrating the measuring operation and the quality testing operation of the testing system shown in FIG. 2.

A testing system in accordance with a preferred embodiment of the present invention will be described hereunder with reference to FIGS. 2 and 3. FIG. 2 is a block diagram showing the circuit configuration of a testing system; while, FIG. 3 is a circuit diagram of a signal transmission circuit, constituting a part of the testing system, for illustrating generation of measuring signals and the supply of these signals to a to-be-measured IC, the recording of measured results and the quality discrimination.

First, the circuit configuration of the overall testing system will be described hereunder with reference to FIG. 2.

As a controller 10, a digital electronic computer is particularly employed. The system also includes a pattern signal generator 11, a precision measuring source and D.C. parameter measuring circuit 12, a monitor circuit 13, a time measuring circuit 14, an audio signal generator 15, a high frequency (e.g., VHF) signal generator 16 and a video signal generator 17. It is to be noted that since the time measuring circuit 14 through the video signal generator 17 are optionally provided, they may be omitted depending on the measuring items and replaced by other devices.

According to the features of the present invention, a plurality of signal transmission circuits 20a, 20b, 20c are provided corresponding to a plurality of connection pins Tl, Tm, Tn of a to-be-measured IC as a device under test (referred to as "D.U.T." hereinafter) 21. The term D.U.T. refers to a device (a circuit or element or electronic circuit) to be measured by the testing system, or known among those who are skilled in the art.

The plurality of signal transmission circuits 20a, 20b, 20c perform required operations in response to control signals supplied from the controller 10 through a control bus 51. It is to be noted that the controller 10 and the signal transmission circuits 20 are connected to a data bus 50.

The practical circuit configuration and circuit operation of each of the signal transmission circuits 20a, 20b, 20c will be described hereinafter with reference to FIG. 3. Moreover, the present invention has the following features.

(1) A first signal generator 31 and a second signal generator 32 for setting measuring conditions of the connection pin Tl (Tm, Tn) of the D.U.T. 21 are disposed in each signal transmission circuit 20a (20b, 20c). In each of the signal generators 31, 32, information for setting a measuring condition is stored in the form of digital data, which is D-A converted, and the D-A converted output determines the measuring condition.

(2) Analog switches 31d, 32d are provided for selecting one of the D-A converted outputs of the first signal generator 31 and the second signal generator 32 as a measuring condition of the connection pin Tl.

(3) A first discriminator 41 and a second discriminator 42 for discriminating the quality of measured results of each connection pin Tl (Tm, Tn) of the D.U.T. 21 are disposed in each signal transmission circuit 20a (20b, 20c). In each of the discriminators 41, 42, reference value information for discriminating the quality of a measured result is stored in the form of digital data, which is D-A converted, and moreover, the D-A converted output and a measured result of the connection pin Tl (Tm, Tn) are compared with each other.

(4) The controller 10 controls the operation of each of the signal transmission circuits 20a, 20b, 20c via the control line 51.

The testing system according to the present invention having the above-mentioned features can be used in the following multifunctional application forms.

(5) One of the D-A converted outputs of the first and second signal generators 31, 32 determines the high level of a digital signal as one of the measuring conditions of the connection pin Tl (Tm, Tn), while the other D-A converted output determines the low level of a digital signal as the other measuring condition of the connection pin Tl (Tm, Tn). The changeover between the above-mentioned high level and low level is carried out at high speed by means of the analog switches 31d, 32d.

(6) Otherwise, at least one of the D-A converted outputs of the first and second signal generators 31, 32 determines the D.C. level of an analog D.C. signal as a measuring condition of the connection pin Tl (Tm, Tn).

(7) The first discriminator 41 discriminates whether the low level of a digital signal as one of the measured results of the connection pin Tl (Tm, Tn) is lower than a predetermined lower reference value or not, while the second discriminator 42 discriminates whether the high level of a digital signal as another measured result of the connection pin Tl (Tm, Tn) is higher than a predetermined higher reference value or not.

(8) The first discriminator 41 discriminates whether an analog D.C. signal as a measured result of the connection pin Tl (Tm, Tn) is higher than a predetermined lower limit or not, while the second discriminator 42 discriminates whether the analog D.C. signal as a measured result of the connection pin Tl (Tm, Tn) is lower than a predetermined upper limit or not.

(9) The controller 10 instructs the signal transmission circuits 20a, 20b, 20c to selectively carry out at least one of the above-mentioned setting of digital measuring conditions (5), the above-mentioned setting of analog measuring conditions (6), the above-mentioned discriminating of digital measured results (7), and the above-mentioned discriminating of analog measured results (8).

Alternatively, an auxiliary control circuit (not shown) is disposed in each signal transmission circuit 20a (20b, 20c). This auxiliary control circuit is controlled by the controller 10 so as to make the signal transmission circuit 20a (20b, 20c) carry out at least one of the above-mentioned setting of digital measuring conditios (5), the above-mentioned setting of analog measuring conditions (6), the above-mentioned discriminating of digital measuring results (7), and the above-mentioned discriminating of analog measuring results (8), selectively.

The preferred embodiment of the present invention will be described hereunder in greater detail.

The first signal generator 31 comprises: a digital memory 31a; a digital-analog converter (referred to as "D-A converter" hereinafter) 31b; a voltage amplifier 31c, including a voltage range change-over resistor $VR_1$ permitting the voltage range of output signals (measuring signals) to be changed over stepwisely as well as at will from, e.g., about 2 V to about 30 V, and a negative feedback resistor $R_{f1}$; and an analog switch 31d. In addition, the memory 31a records digital data corresponding to the voltage range required for measurement. Readout is effected in response to a control signal supplied from the controller 10 through the control bus 51. Then a voltage based on this readout is generated in the D-A converter 31b, and the range thereof is set by the resistor $VR_1$ to determine an actual output voltage.

The second signal generator 32 has the same circuit configuration as the above-described first signal generator 31. When a pattern signal having any waveform is supplied to a line $l_0$ from the pattern signal generator 11, the analog switch 31d is changed over to the ON state when the pattern signal is at the high level. On the other hand, when the pattern signal is at the low level, the analog switch 32d is changed over to the ON state. Thus, the first signal generator 31 determines the high level of the signal fed to a line $l_1$, while the second signal generator 32 determines the low level of the signal fed to the line $l_1$.

Although each of amplifiers 33, 34 constitutes a buffer amplifier, the amplifier 34 functions as a current feedback amplifier when a switch $SW_1$ is in the ON state. A resistor $VR_3$ is provided for setting the measuring current range. A clamper 38 for protecting the buffer amplifiers and the to-be-measured IC 21 as a D.U.T. is composed of diodes $D_1$, $D_2$, $D_3$, $D_4$. Switches $SW_3$, $SW_4$ are selectively changed over according to the desired measuring items of the to-be-measured IC 21 as a D.U.T. In addition, a feed terminal $T_2$ and a sense terminal $T_1$ of the signal transmission circuit 20a (20b, 20c) are connected to a desired connection pin Tl of the to-be-measured IC 21. An analog switch 35 is changed over to the ON state in measuring current, while an analog switch 36 is changed over to the ON state in measuring voltage. An amplifier 37 functions as a voltage scale adjuster.

A lower-limit setting circuit 41 and a higher-limit setting circuit 42, which constitute discriminators in the present invention, perform a discrimination of the quality of the to-be-measured IC 21 as a D.U.T. and provide an output for recording of measured results. The lower-limit setting circuit 41 comprises a voltage comparator 41a, an inverter 41b, an AND circuit 41c, a digital memory 41d, another digital memory 41e in which a lower-limit reference voltage value is previously recorded, and a D-A converter 41f for D-A converting the output signals of the digital memory 41e.

The higher-limit setting circuit 42 has the same circuit configuration as the lower-limit setting circuit 41. However, the voltage level corresponding to the digital data recorded in a digital memory 42e is a higher-limit reference voltage and is set so as to be higher than the voltage level corresponding to the digital data recorded in the above-mentioned digital memory 41e. Moreover, the pattern signal from the pattern signal generator 11 is supplied to a line $l_2$ and applied to each of the input terminals of the AND circuits 41c, 42c.

A direct measuring circuit 43 is composed of an A-D converter 43a and a digital memory 43b for recording the output voltage of the A-D converter 43a. It is to be noted that a line $l_3$ is for transmitting measured results to the monitor circuit 13, while a line $l_4$ is for supplying any measuring signal to the to-be-measured IC 21. Moreover, a line $l_5$ is for selectively changing over the analog switches 35, 36 to the ON or OFF state according to the selected measuring items.

The circuit operation will be described in the case where the current characteristics of the to-be-measured IC 21 in accordance with a predetermined measuring voltage are measured and the quality thereof is tested according to measured results.

In this case, the switch $SW_1$ is changed over to the OFF state, while the switch $SW_2$ is changed over to the ON state. Moreover, the analog switch 35 is changed over to the ON state, while the analog switch 36 is changed over to the OFF state. Further, the switches $SW_3$, $SW_4$ are changed over the ON state, the switch $SW_5$ is changed over to the side of a contact b, and the switch $SW_6$ is changed over to the OFF state. Accordingly, the measured signal obtained from the connection pin Tl of the to-be-measured IC 21 is not supplied to the monitor circuit 13.

Under the above-mentioned state, when a high level signal is supplied to the line $l_0$, via the switch 31d the measuring voltage signal of the first signal generator 31 is fed to the line $l_1$.

Since a 100% voltage feedback loop is formed from the output of the amplifier 33 to the inverting input terminal (−) of the amplifier 33 via the resistor $VR_3$, the switch $SW_4$, the feed terminal $T_2$, the sense terminal $T_1$ and the switches $SW_3$, $SW_2$, the voltage at the feed terminal $T_2$ becomes equal to the measuring voltage at the line $l_1$. Thus, the measuring voltage at the pin Tl can be determined.

As described above, when the measuring voltage signal is supplied to the connection pin Tl of the to-be-measured IC 21, there is a voltage drop corresponding to a current quantity across the resistor $VR_3$. The current quantity varies depending on the quality of the characteristics of the to-be-measured IC 21, and the voltage drop portion across the resistor $VR_3$ corresponding to the variation is a differential input with respect to the amplifier 34. Therefore, an output voltage signal $I_M$ having a level change corresponding to the voltage drop portion is generated from the amplifier 34. In other words, the amplifier 34 and the resistor $VR_3$ function as a current-voltage converter.

Simultaneously with the above-described operation, the output voltage signal $I_M$ of the amplifier 34 is supplied to the line $l_5$ through the analog switch 35 and then is supplied to each of the voltage comparators 41a, 42a and the A-D converter 43a.

The input terminal b of the voltage comparator 41a is previously supplied with the reference voltage corresonding to the digital data recorded in the memory 41e, as mentioned above. Also, the input terminal b of the voltage comparator 42a is previously supplied with the reference voltage corresponding to the digital data recorded in the memory 42e. It has been also mentioned that the reference voltages are different in voltage level from each other.

Accordingly, each of the voltage comparators 41a, 42a performs a voltage comparison between the above-mentioned reference voltage and the output signal $I_M$. First, the circuit operation of the lower-limit setting circuit 41 will be described hereunder. When the voltage level of the output signal $I_M$ is higher than the reference voltage, a low-level output signal is obtained from the voltage comparator 41a. This output signal is inverted to high level by the inverter 41b and supplied to an input terminal a of the AND circuit 41c in the subsequent stage.

The input terminal b of the AND circuit 41c is previously supplied with the pattern signal. Accordingly, when the input terminal b is made high in level by the above-mentioned pattern signal, a high-level output signal is obtained from the AND circuit 41c and recorded by the memory 41d. In other words, the memory 41d records that, with respect to the current characteristics of the to-be-measured IC 21, at least the analog D.C. current of the connection pin Tl converted into the output voltage signal $I_M$ is not lower than the lower-limit level within its allowable range.

Next, the higher-limit setting circuit 42 will be described hereunder, when the voltage level of the reference voltage corresponding to the digital data stored in the memory 42e is higher than the output signal $I_M$ or $V_S$, a low-level output signal is obtained from the voltage comparator 42a. This output signal is inverted into high level by the inverter 42b and supplied to an input terminal a of the AND circuit 42c in the subsequent stage. When the pattern signal supplied to the input terminal b is high level, a high-level output signal is obtained from the AND circuit 42c and recorded in the memory 42d.

As described above, when the voltage level of the output signal $I_M$ or $V_S$ of the amplifier 34 is within a quality discrimination allowable range, the voltage level is recorded with respect to each of the lower-limit and higher-limit levels. When the voltage level of the output signal $I_M$ or $V_S$ is lower than the lower-limit level, no high voltage level is recorded in the memory 41d. Also, with respect to the higher-limit level, completely the same operation is carried out, and when the voltage level of the output signal $I_M$ or $V_S$ is higher than the higher-limit level, no high voltage level is recorded in the memory 42d.

By the way, while the quality testing is being carried out through the output signal $V_S$ with respect to the lower-limit and higher-limit levels, the following operation can be performed in the direct measuring circuit 43. Namely, since the output signal $V_S$ is an analog signal in the form of a pulse corresponding to the period of the pattern signal, the output signal $I_M$ or $V_S$ is digitized by the A-D converter 43a. The pulses of this digital signal vary with the voltage level of the output signal $I_M$ or $V_S$. The above-mentioned digital signal is recorded in the memory 43b. Accordingly, it is possible to obtain data different from the quality discrimination data on the to-be-measured IC 21 by reading out the digital signal recorded in the memory 43b. The signal recorded in the memories 41d, 42d, 43d, i.e., the data for testing the quality of the to-be-measured IC 21 are read and displayed by the controller 10 (i.e., electronic computer).

The circuit operation in the case of measuring voltage in accordance with a predetermined measuring current will be described hereunder.

In this case, the switch $SW_1$ is changed over to the ON state while the switch $SW_2$ is changed over to the OFF state. Moreover, the switches $SW_3$, $SW_4$ are changed over to the ON state, the switch $SW_5$ is changed over to a terminal a, and the switch $SW_6$ is changed over to the OFF state. Further, the analog switch 35 is changed over to the OFF state, while the analog switch 36 is changed over to the ON state.

A predetermined voltage signal from the first signal generator appears at the line $l_1$ in the same process as described in the case of measuring current.

The output signal of the amplifier 33 is supplied to a desired connection pin Tl of the to-be-measured IC 21 through the resistor $VR_3$, the switch $SW_4$ and the feed terminal $T_2$. The output current of the amplifier 33 flowing in the resistor $VR_3$ and the feed terminal $T_2$ can be determined in the following manner. Namely, the product of the voltage drop across the resistor $VR_3$ and the voltage gain of the amplifier 34 becomes equal to the voltage at the line $l_1$. Thus, the measuring current flowing into the connection pin Tl can be determined.

The measured voltage signal appearing at the terminal $T_1$ is supplied to the amplifier 37 through the switch $SW_5$. It is to be noted that the amplifier 37 may perform either amplification or attenuation at a predetermined ratio. The output signal $V_M$ of the amplifier 37 appears at the line $l_s$ through the analog switch 36 which is now in the ON state. Then, the output signal $V_M$ is supplied to the input terminal a of each of the voltage comparators 41a, 42a and the A-D converter 43a.

Then, the lower-limit setting circuit 41, the higher-limit setting circuit 42 and the direct measuring circuit 43 operate in the same way as described in the case of measuring current. Accordingly, each of the memories 41d, 42d, 43d readably stores data for testing the quality of voltage at the connection pin Tl of the to-be-measured IC 21.

The circuit operation in the case of monitoring the measuring signal will be described hereunder. In this case, the switches $SW_3$, $SW_4$ are changed over to the ON state, the switch $SW_5$ is changed over to the contact b, and the switch $SW_6$ is changed over to the OFF state.

A control signal is supplied to the to-be-measured IC 21 as described with respect to the measurement of current and the measurement of voltage. The measured signal obtained from the to-be-measured IC 21 is supplied to the monitor circuit 13 from the sense terminal $T_1$ through the contact b of the switch $SW_5$, the line $l_3$, the switch $SW_7$ and the analog bus 51.

Figure 1:
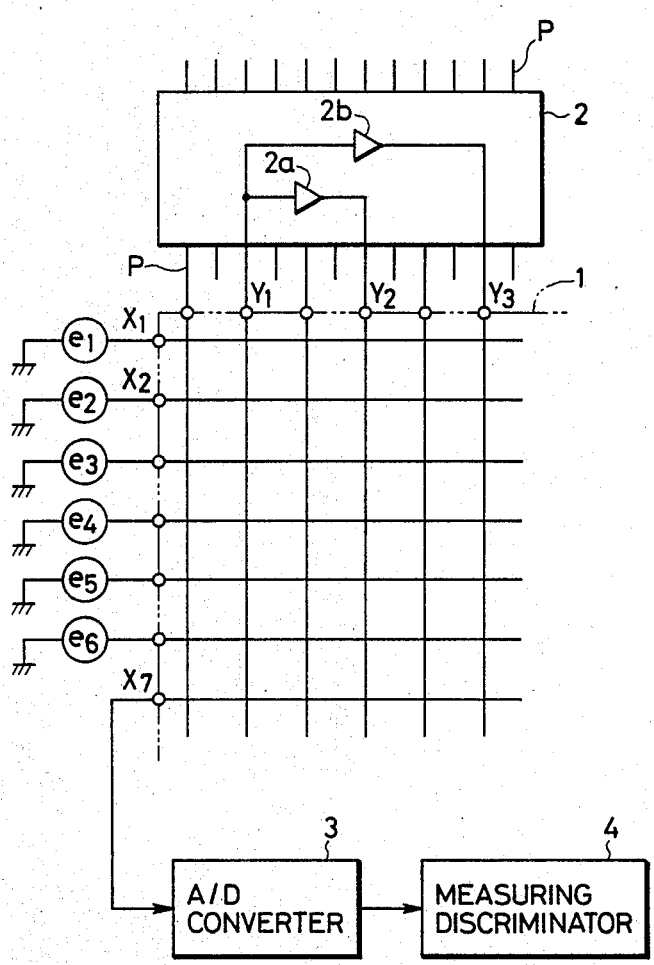
FIG. 1 is a circuit diagram of a semiconductor device testing system considered by the inventors prior to the present invention.

It is to be noted that although the measuring signal obtained from the amplifier 33 is supplied to the to-be-measured IC 21 in the present embodiment, it is also possible to connect the amplifier 33 to an external measuring circuit instead. This can be shown in an example of connection with the precision measuring source and D.C. parameter measuring circuit 12 (referred to as "precision measuring circuit" hereinafter). In this case, the switches $SW_3$, $SW_4$ are changed over to the OFF state, the switch $SW_5$ is changed over to the contact b, and the switch $SW_6$ is changed over to the ON state. The signal from the precision measuring circuit 12 is supplied to a desired connection pin Tl of the to-be-measured IC 21 through a switch $SW_8$, the line $l_4$, the switch $SW_6$ and the feed terminal $T_2$. Voltage or current can be also measured in the same way as shown in FIG. 1.

The circuit operation in the case of carrying out digital measurement will be described hereunder.

In the case, the lines $l_0$, $l_2$ are supplied with control pulses for determining the measuring timing. Then, it also becomes possible to effect a digital function testing by carrying out the same operation as those in measuring current and voltage, as described in the abovementioned setting of digital measuring conditions (5) and the abovementioned discriminating of digital measured results (7).

In the present embodiment, various measuring methods have been described with respect to one connection pin Tl in the connection pins of the to-be-measured IC 21. It is, however, possible to simultaneously conduct the above-mentioned various measurements with respect to the other connection pins Tm, Tn of the to-be-measured IC 21 by employing the other signal transmission circuits 20b, 20c. Accordingly, while, for example, current is being measured with respect to one connection pin Tl, for example, the relationships between inputs and outputs of other amplifiers are measured with respect to the other connection pins Tm, Tn. Therefore, it is possible to perform tests based on measurements of both of them.

Moreover, it is possible to simultaneously conduct tests which are conventionally carried out individually and subordinately, such as a test of connection immediately after application of a source, a bias test of all terminals, a leakage test, etc., so that the quality of the to-be-measured IC 21 can be discriminated in an extremely-short period of time. In addition, the switches $SW_1$ to $SW_9$ changed over correspondingly to measuring items may be constituted by reed relays, since there is low frequency in use of these switches and the reed relays have no particular adverse effects on the above-described circuit operations.

On the other hand, in the digital memory 31a of the first signal generator 31 or the digital memory 32a of the second signal generator 32 digital information which is quantized from an analog sine-wave measuring data can be recorded. Thus, the analog sine-wave measuring voltage can be obtained from the output of the D-A converter 31b or 32b, serially.

Also, in the digital memory 43b of the direct measuring circuit 43 digital information which is quantized from an analog sine-wave measured data by the A-D converter 43a can be recorded. This digital information in the digital memory 43b can be analyzed by the controller 10 (i.e., the digital computer) in view of the phase, the amplitude and the frequency components.

As will be fully understood from the foregoing description, according to the testing system for semiconductor devices to which the present invention is applied, since various characteristics of a semiconductor device can be simultaneously measured, it is possible to effect discrimination or testing of the quality of the semiconductor device based on the measured results in an extremely short period of time. These effects become more remarkable as the integration degree becomes higher and the number of lead pins of a to-be-measured device becomes larger. Moreover, since it is possible to record measuring signals required for measuring semiconductor devices and the testing results based thereon, there is no need for feeding a measuring signal and the measured result corresponding thereto back to an electronic computer, as data, for each measuring item. Further, since there are a smaller number of switching elements with mechanical structures, the reliability of the whole system is improved and moreover production costs can be largely reduced.

What is claimed is:

1. A testing system for testing device under test comprising:
   a plurality of signal transmission circuits each connected to a respective one of a plurality of connection pins of said device under test, each of said signal transmission circuits including signal generator means for generating a signal to establish a measuring condition for said one of said plurality of connection pins, discriminator means for discriminating the quality of the measured result from said one connection pin against a reference value and connection means for connecting said signal generator means and said discriminator means to said one connection pin so that a selected measuring condition can be established; and
   controller means for controlling the operations of said plurality of signal transmission circuits;
   wherein said signal generator means of each of said signal transmission circuits includes first digital memory means connected to said controller means for storing digital data for establishing said measuring condition at said one connection pin and a first D-A converter connected to the output of said first digital memory means and to said connection means, said discriminator means of each of said signal transmission circuits includes second digital memory means connected to said controller means for storing reference value information for discriminating the quality of a measured result from said one connection pin, a second D-A converter connected to the output of said second memory means, voltage comparator means for effecting a comparison between an output of said second D-A converter and said measured result of said one connection pin received via said connection means and third digital memory means connected to said controller means for storing the measured discriminated result as represented by the output of said voltage comparator means, wherein said connection means includes first means for supplying from said signal generator means to said one connection pin a measuring voltage to establish said measuring condition with said one connection pin and second means for detecting a value of a current flowing through said one connection pin as said quality of measured result and for applying to said discriminator means a signal representing the value of said current for discrimination against said reference value.

2. A testing system according to claim 1, wherein said signal generator means of each of said signal transmission circuits further includes switching means for carrying out transmission and non-transmission of an output of said first D-A converter in response to a control signal received from said controller means.

3. A testing system according to claim 2, wherein each of said signal transmission circuits further includes A-D converting means for A-D converting said measured result of said one connection pin and fourth digital memory means for storing an output of said A-D converting means.

4. A testing system according to claim 2, wherein each of said plurality of signal transmission circuits includes first and second signal generator means of the same configuration connected by said connection means to said one connection pin and first and second discriminator means connected by said connection means to said one connection pin.

5. A testing system according to claim 1, wherein said connection means includes amplifier means having a feedback loop for connecting the output of said signal generator means to said one connection pin.

6. A testing system according to claim 5, wherein said amplifier means includes a first amplifier having a feedback loop, the input of said amplifier being connected to the output of said signal generator means and its output being connected through a resistance element to said one connection pin, said connection means including a second amplifier connected to detect the voltage drop across said resistance element and having its output connected to said voltage comparator means in said discriminator means.

7. A testing system according to claim 4, wherein first and second digital data are stored in said first digital memory means in said first and second signal generator means of at least one of said plurality of signal transmission circuits as high and low data values in a range of data values, respectively, so that the output of one of said first and second D-A converters represents the high level in said range of data values of a digital signal as one of the measuring conditions of said one connection pin, while the output of the other represents the low level in said range of data values of a digital signal as another measuring condition of said connection pin.

8. A testing system according to claim 1, wherein digital data is stored in said first digital memory means of at least one of said plurality of signal transmission circuits, so that the output of said first D-A converter represents a D.C. level of an analog signal as a measuring condition of said one connection pin.

9. A testing system according to claim 4, wherein said discriminator means in at least one of said plurality of signal transmission circuits includes means for discriminating whether the low level in a range of data values of a digital signal as one of the measured results of said one connection pin is lower than a predetermined lower reference value or not; while, the other discriminator means in the same signal transmission circuit includes means for discriminating whether the high level in said range of data values of a digital signal as another measured result of said one connection pin is higher than a predetermined higher reference value or not.

10. A testing system according to claim 4, wherein said discriminator means in at least one of said plurality of signal transmission circuits includes means for discriminating whether an analog D.C. signal as a measured result of said one connection pin is higher than a predetermined lower limit or not; while, the other discriminator means in the same signal transmission circuit includes means for discriminating whether said analog D.C. signal is lower than a predetermined higher limit or not.

11. A testing system for testing device under test comprising:
    a plurality of signal transmission circuits each connected to a respective one of a plurality of connection pins of said device under test, each of said signal transmission circuits including signal generator means for generating a signal to establish a measuring condition for said one of said plurality of connection pins, discriminator means for discriminating the quality of the measured result from said one connection pin against a reference value and connection means for connecting said signal generator means and said discriminator means to said one connection pin so that a selected measuring condition can be established; and
    controller means for controlling the operations of said plurality of signal transmission circuits;
    wherein said signal generator means of each of said signal transmission circuits includes first digital memory means connected to said controller means for storing digital data for establishing said measuring condition at said one connection pin and a first D-A converter connected to the output of said first digital memory means, said discriminator means of each of said signal transmission circuits includes second digital memory means connected to said controller means for storing reference value information for discriminating the quality of a measured result from said one connection pin, a second D-A converter connected to the output of said second memory means, voltage comparator means for effecting a comparison between an output of said second D-A converter and said measured result of said one connection pin received via said connection means and third digital memory means connected to said controller means for storing the measured discriminated result as represented by the output of said voltage comparator means, wherein said connection means includes first means for supplying from said signal generator means to said one connection pin a measuring current to establish said measuring condition with said one connection pin and second means for detecting a value of a voltage generated from said one connection pin as said quality of measured result and for applying to said discriminator means a signal representing the value of said voltage for discrimnation against said reference value.

12. A testing system according to claim 11, wherein said signal generator means of each of said signal transmission circuits further includes switching means for carrying out transmission and non-transmission of an output of said first D-A converter in response to a control signal received from said controller means.

13. A testing system according to claim 11, wherein each of said signal transmission circuits further includes A-D converting means for A-D converting said measured result of said one connection pin and fourth digital memory means for storing an output of said A-D converting means.

14. A testing system according to claim 11, wherein said connection means includes amplifier means having a feedback loop for connecting the output of said signal generator means to said one connection pin.

15. A testing system according to claim 14, wherein said amplifier means includes a first amplifier having an input connected to the output of said signal generator means and its output connected through a resistance element to said one connection pin, and said feedback loop including a further amplifier connected to detect the voltage drop across said resistance element and having its output connected to an input of said first amplifier, said connection means including further means for connecting said one connection pin to the voltage comparator means in said discriminator means.

* * * * *